US012721069B2

(12) United States Patent
Camalleri et al.

(10) Patent No.: US 12,721,069 B2
(45) Date of Patent: Aug. 25, 2026

(54) PROCESS FOR MANUFACTURING LOCALIZED ION IMPLANTS IN SILICON-CARBIDE POWER ELECTRONIC DEVICES

(71) Applicant: STMicroelectronics International N.V., Geneva (CH)

(72) Inventors: Cateno Marco Camalleri, Catania (IT); Mario Giuseppe Saggio, Aci Bonaccorsi (IT); Edoardo Zanetti, Valverde (IT); Gabriele Bellocchi, Catania (IT)

(73) Assignee: STMicroelectronics International N.V., Geneva (CH)

( * ) Notice: Subject to any disclaimer, the term of this patent is extended or adjusted under 35 U.S.C. 154(b) by 359 days.

(21) Appl. No.: 18/583,752

(22) Filed: Feb. 21, 2024

(65) Prior Publication Data

US 2024/0297044 A1 Sep. 5, 2024

(30) Foreign Application Priority Data

Mar. 3, 2023 (IT) ........................ 102023000003906

(51) Int. Cl.
*H10P 30/22* (2026.01)

(52) U.S. Cl.
CPC .................................... *H10P 30/22* (2026.01)

(58) Field of Classification Search
CPC ....................................................... H10P 30/22

(Continued)

(56) References Cited

U.S. PATENT DOCUMENTS 8,329,541 B2 * 12/2012 Ye ........................ H10D 30/015 257/E21.409
2018/0308972 A1 10/2018 Ohse et al.
(Continued)

FOREIGN PATENT DOCUMENTS

WO 2022178252 A1 8/2022

OTHER PUBLICATIONS

Linnarsson et al., "Influence of a thin amorphous surface layer on de-channeling during aluminum implantation at different temperatures into 4H—SiC", Appl. Phys. A 125, 849 (Nov. 7, 2019), 7 pages.

*Primary Examiner* — Ajay Arora
(74) *Attorney, Agent, or Firm* — Seed IP Law Group LLP

(57) ABSTRACT

A manufacturing process provides for: forming a semiconductor body of silicon carbide, having a front surface; performing a localized ion implantation to form implanted regions in implant portions in the semiconductor body. The step of performing a localized ion implantation provides for: forming damaged regions at the front surface, separated from each other by the implant portions in a direction parallel to the front surface; performing a channeled ion implantation, for implanting doping ions within the semiconductor body and forming the implanted regions at the implant portions of the semiconductor body. The channeled ion implantation is performed in a self-aligned manner with respect to the damaged regions, which represent damaged regions of the silicon-carbide crystallographic lattice such as to block a propagation of the channeled ion implantation along a vertical axis orthogonal to the front surface, in a depth direction of the semiconductor body.

20 Claims, 5 Drawing Sheets

(58) Field of Classification Search
USPC .......................................................... 438/519
See application file for complete search history.

(56) References Cited

U.S. PATENT DOCUMENTS

| | | | | |
|---|---|---|---|---|
| 2019/0140095 | A1 | 5/2019 | Okumura | |
| 2019/0172944 | A1 | 6/2019 | Okumura | |
| 2020/0259022 | A1 * | 8/2020 | Konstantinov .......... | H10D 8/60 |
| 2022/0320268 | A1 | 10/2022 | Moriya | |
| 2022/0336590 | A1 | 10/2022 | Kumada | |
| 2022/0359710 | A1 | 11/2022 | Zhang et al. | |
| 2024/0297043 | A1 | 9/2024 | Guarnera et al. | |
| 2024/0297249 | A1 | 9/2024 | Guarnera et al. | |

* cited by examiner 22 21 22 24 1a

2

20 20 1b z y x 21
1a
1
1b
12
22
10
20
12
22
24
20
10
12
2
z
y
x 32
26
32
31
26
21
30
32
26
31
100
28
31
1a
30
30
1b
20
22
10
12
22
24
20
12
10
2
z
y
x

PROCESS FOR MANUFACTURING LOCALIZED ION IMPLANTS IN SILICON-CARBIDE POWER ELECTRONIC DEVICES

BACKGROUND

Technical Field

The present disclosure relates to a process for manufacturing localized ion implants in power electronic devices; in particular, the following discussion will make particular reference to a power electronic device, for example of a MOSFET type, formed starting from a silicon-carbide, SiC, substrate.

Description of the Related Art

As it is known, semiconductor materials having a wide bandgap, for example greater than 1.1 eV, low on-state resistance, high thermal conductivity, high operating frequency and high saturation velocity of charge carriers provide electronic devices, for example diodes and transistors, which may have better performances than silicon electronic devices, in particular for power applications, for example with operating voltages comprised between 600 V and 1300 V and/or in specific operating conditions such as high temperature.

In particular, these power electronic devices may advantageously be manufactured starting from a wafer of silicon carbide, a material having the characteristics listed above, in one of its polytypes, for example 3C-SiC, 4H-SiC or 6H-SiC.

In a known manner, the introduction of dopants into a silicon-carbide substrate generally occurs by ion implant, since dopant diffusion is not an applicable technique due to the low diffusivity of the silicon carbide compared to other semiconductor materials (such as for example silicon) and epitaxial growth might not be a useful alternative, especially for locally confined volumes.

In particular, several implant steps, performed at different conditions (for example, in terms of doses and energy), are typically required for forming a region having a desired doping profile and a desired depth in the silicon-carbide substrate.

In order to provide locally confined implants (so-called patterned implants), it is known to use hard mask, for example made of oxide or photoresist, formed above the substrate and configured to locally shield the silicon-carbide substrate during the implant step.

However, it has been verified that the use of masks of the aforementioned type may cause planarity issues, after removal of the same masks, due to lattice stress effects generated on the silicon-carbide substrate (also due to the time required for carrying out the various implant steps).

The known solutions and options for manufacturing localized ion implants in silicon-carbide substrates are therefore rather complex, entail rather high times and costs and moreover may cause issues, such as for example the discussed issues in terms of planarity of the same substrates.

BRIEF SUMMARY

The present disclosure is at least in part provided to address the previously highlighted issues, to provide an alternative way of manufacturing localized (or patterned) ion implants in electronic devices, in particular with respect to power electronic devices formed starting from silicon-carbide substrates, which is simpler and cheaper to implement and manufacture.

According to the present disclosure, one or more embodiments of a manufacturing process is therefore provided.

For example, in at least one embodiment, a manufacturing process may be summarized including: forming a semiconductor body of silicon carbide, having a front surface; and performing a localized ion implantation to form implanted regions in implant portions of the semiconductor body, wherein performing a localized ion implantation comprises: forming damaged regions at the front surface, separated from each other by the implant portions in a direction parallel to the front surface; and performing a channeled ion implantation, for implanting doping ions within the semiconductor body and forming the implanted regions at the implant portions of the semiconductor body, wherein the channeled ion implantation is performed in a self-aligned manner with respect to the damaged regions, constituting damaged regions of the silicon carbide crystallographic lattice such as to block propagation of the channeled ion implantation along a vertical axis orthogonal to the front surface, in a depth direction of the semiconductor body.

BRIEF DESCRIPTION OF THE SEVERAL VIEWS OF THE DRAWINGS

For a better understanding of the present disclosure, a preferred embodiment thereof is now described, purely by way of non-limiting example and with reference to the attached drawings, wherein.

DETAILED DESCRIPTION

Figure 1A:
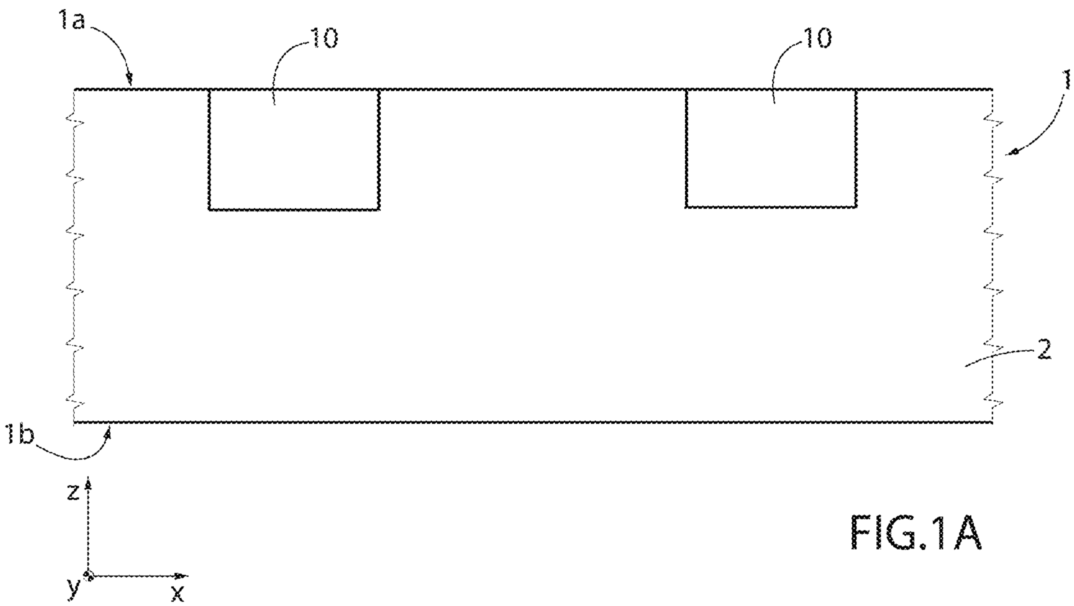
FIGS. 1A-1B show a cross-section of a wafer of semiconductor material, in particular silicon carbide, in consecutive ion implantation steps during a manufacturing process, according to one aspect of the present disclosure.

As will be described in detail below, one aspect of the present disclosure provides for manufacturing localized, or patterned, ion implants, i.e., being confined to desired and selected regions of a substrate (unlike blank implants carried out on the entire substrate), by means of a channeled-type ion implantation process (in a so-called "channeling" condition).

The present disclosure described may find advantageous application in an electronic device, in particular a power electronic device having a silicon-carbide substrate.

In a known manner, the channeling condition occurs when the direction of the implanted ion beam is oriented along one of the semiconductor material crystallographic axes, substantially parallel thereto.

When implanted in the crystal lattice, the ions generally tend to disperse due to impacts with the atoms of the crystal lattice (according to the phenomenon of impact scattering).

In particular, when the implant direction is oriented at an oblique angle with respect to the main axes of the crystal lattice, the atoms in the lattice have a random distribution with respect to the implant direction; the probability of collisions between the implanted ions and the atoms of the crystal lattice is therefore substantially uniform along the depth. Therefore, in this implant condition, doping profiles, substantially Gaussian with respect to the depth, are obtained, where the depth reached by the implant is determined by the energy, the ions used and the atomic structure of the target.

If the implant direction is instead a channeling direction, close to a main axis of the crystal lattice, the atoms in the crystal lattice define "channels" that may be freely traversed by the implanted ions. This reduces the probability of collisions between the implanted ions and the atoms of the crystal lattice, especially near the surface of the wafer where the implant occurs, resulting in that the depth of the same implant may be significantly increased.

In general, implant channeling occurs when the implant direction is within a critical angle with respect to the channeling direction. In this configuration, the loss of electron energy (interaction with the electron clouds of the crystal atoms) is prevalent with respect to the nuclear loss (impacts with the crystal nuclei). The value of the critical angle depends for example on the direction, the species and the energy used.

As used herein, the term "implant angle" refers to the tilt angle of the wafer that is used during the implant. It may be defined in general as an angle with respect to the surface of the wafer. In general, the surface of the wafer is not a crystallographic plane, as it is defined by a cut angle suitable for the successive epitaxial processes, for example 4°; in the example, therefore, to identify the <0001> direction of the crystal lattice during the implant, the wafer needs to be tilted with a tilt angle of 4°.

Channeling is typically an undesired effect during the manufacturing of power electronic devices (for example, because the implant depth may be greater than a desired depth and because it is difficult to control the value of the same depth) and the implant direction is therefore generally oriented in a non-channeling direction, to minimize channeling effects.

As previously indicated, the present Applicant has however verified the possibility of providing, in a controlled and repeatable manner, channeled implants within the process for manufacturing a silicon-carbide electronic device, for forming corresponding localized (i.e., performed selectively with respect to a corresponding substrate) ion implants extending throughout a desired depth within the same substrate.

In particular, the Applicant has verified that the channeling effect may be altered by (intentional) damage to a region of the surface of the substrate wherein the channeled implant is carried out.

This Intentionally Damaged Region (IDR) may be obtained, for example, by surface ion implant (of a random, unchanneled type) of non-reactive or non-doping species, i.e., such as to cause damage to the crystal lattice, without locally altering the conductivity characteristics thereof. Chemical species suitable for this purpose include, for example, Silicon (Si), Argon (Ar) or Germanium (Ge) atoms.

Alternatively, the damage may be obtained by ion implant of doping species (for example having a conductivity opposite to that of the substrate), as may be for example the case where the process for manufacturing the electronic device already provides for the presence of surface doped regions (as will be described in greater detail below).

According to a further embodiment, the intentionally damaged region may be formed by one or more etching steps of the front side of the semiconductor substrate. In particular, in order to damage by etching only the desired surface portion an etching mask may be used, exposing only this desired surface portion.

Therefore, as a result of the aforementioned damage (provided by ion implant or by etching), the substrate has, at the damaged region, a different lattice structure. In particular, the semiconductor material, where damaged, has an amorphous structure or a disordered crystal structure, or a lattice structure devoid of the spatial symmetry otherwise present in the remaining portions (not intentionally damaged) of the substrate.

Figure 1B:
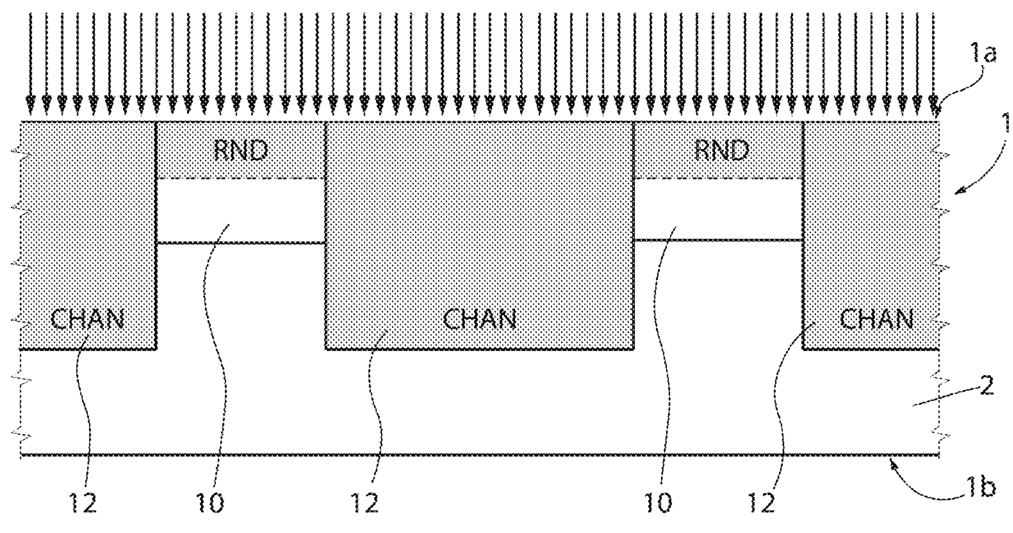
Figure 1B:
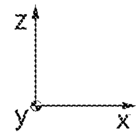

FIG. 1A shows a wafer 1 comprising a semiconductor body 2 of silicon carbide, for example of 4H-SiC type having a doping with n-type conductivity and delimited by a front surface 1*a* and a rear surface 1*b*, having a main extension in a horizontal plane xy and opposite to each other along a vertical axis z, orthogonal to the horizontal plane xy. These planes are referred to as horizontal and vertical based on the orientation of these axes as shown in FIGS. 1A and 1B of the present disclosure.

In a possible implementation, this semiconductor body may for example be formed by epitaxial growth starting from a substrate. In particular, following the epitaxial growth, the silicon-carbide crystallographic lattice may be oriented at a certain (non-zero) angle with respect to the surface of the wafer 1. In a possible implementation, the 4H-SiC lattice structure may have an off-cut angle of about 4° (intended as the angle between the surface of the wafer 1 and the main crystallographic plane, for example along the <0001> direction).

According to one aspect of the present disclosure, one or more (intentionally) damaged regions 10 are formed (FIG. 1A shows two of these regions, purely by way of example, separated from each other of a certain distance along a first horizontal axis x of the horizontal plane xy), in order to locally alter the structure of the silicon-carbide crystal lattice and inhibit channeling during a successive channeled implant. For example, the damaged regions 10 have a second crystal lattice different from a first crystal lattice structure of a remainder of the semiconductor body 2 to inhibit channeling during a successive channeled implant.

The damaged regions 10 extend superficially into the semiconductor body 2, at a desired depth along the vertical axis (z) starting from the front surface 1*a*, this depth being comprised for example between 0.1 and 0.6 μm.

Forming the damaged regions 10 comprises, as previously discussed, alternatively performing a surface (unchanneled) ion implant by masking, with a suitable dose of ions (for example non-doping ions) and a low energy (in order to penetrate for a small depth into the semiconductor body 2); or performing one or more surface etching steps of the same semiconductor body 2, starting from the front surface 1*a*.

In detail, forming the damaged regions 10 may comprise using implant doses greater than $10^{13}$ atoms/cm$^2$ and energies sufficient to cause a displacement of the atoms from the crystal structure for the required depth (for example with energy in the range of 30-200 keV). The implant that introduces the damage is not performed in channeling conditions and heating (annealing) of the wafer during the process is avoided, so as not to remove the damage produced.

Alternatively, the damaged regions 10 may be formed by one or more etching steps of the front surface 1*a* of the wafer 1, for example by a RIE (Reactive Ion Etching) etching with physical etching characteristics (ion bombardment). In order to damage by etching only the desired surface portions, an etching mask may be used which exposes only such desired surface portions.

According to one aspect of the present disclosure, as shown in FIG. 1B, a channeled ion implantation, i.e., executed in channeling condition, is then performed for forming implanted regions 12 (CHAN), having desired conductivity (for example also of n-type) and doping (for example greater than the respective doping of the semiconductor body 2). This channeled ion implantation is performed without using masks in the active area.

In particular, following the channeled ion implantation, the implanted regions 12 are localized in portions of the semiconductor body 2 wherein the aforementioned damaged regions 10 are not present, for example in the portions interposed between the aforementioned damaged regions 10.

The same implanted regions 12 do not extend instead where the damaged regions 10 are present, in particular below the same damaged regions 10.

These damaged regions 10 are in fact surface regions heavily damaged from the point of view of the crystal lattice, thus representing a barrier to the implanted ions, which distribute randomly at the surface (at the aforementioned front surface 1*a*) without penetrating along the depth direction.

As a result, the ion implantation in channeling condition is performed in a self-aligned manner with respect to these damaged regions 10, so that the implanted ions proceed in depth, in channeling condition, only where the same damaged regions 10 are not present, forming the aforementioned implanted regions 12 (which have, at the end of the channeled ion implantation, a depth for example greater than that of the damaged regions 10).

At the damaged regions 10, the implantation produces a random doping profile (RND) with a very small depth (as depicted by the dashed line in FIG. 1B) and an implant peak located in proximity of the front surface 1*a*. As indicated, this doping may be substantially negligible, such as not to alter (or in any case so as to modify in a limited and controllable manner) doping of the damaged regions 10. The aforementioned depth may be substantially null, in case the previous doping of the damaged regions 10 (in case of an implant with doping species) has a higher dose than the dopant dose implanted with the channeled implant and opposite conductivity, due to the local inversion of the electrical conductivity type (for example, from n to p).

Conversely, where the same damaged regions 10 (which therefore are a sort of implant mask) are not present, a flat implant profile generates which extends in depth into the semiconductor body 2.

The depth of the ion implantation is therefore modulated in a self-aligned manner with respect to the aforementioned damaged regions 10, without resorting to the use of implant masks (and thus avoiding the disadvantages associated with the use of the same masks).

In greater detail, the channeled ion implantation is performed at a certain angle (tilt angle) with respect to a direction orthogonal to the front surface 1*a* of the wafer 1, in such a way as to provide the channeling conditions and thus allow the channeling of the implanted ions towards the depth of the semiconductor body 2.

In the previously discussed implementation (with the semiconductor body 2 having a 4H-SiC lattice and considering that the implant is performed with phosphorus, P, atoms with an implant energy for example equal to 240 keV, at room temperature), the ion implant may be performed with a tilt angle comprised between 3.5° and 4.5°, for example equal to about 4°, in such a way that the implantation occurs substantially in a channeled manner along the <0001> direction of the crystal lattice.

In a further possible embodiment, the implant is performed with aluminum (Al) atoms, with an implant energy for example equal to 640 keV, again at room temperature.

Figure 2:
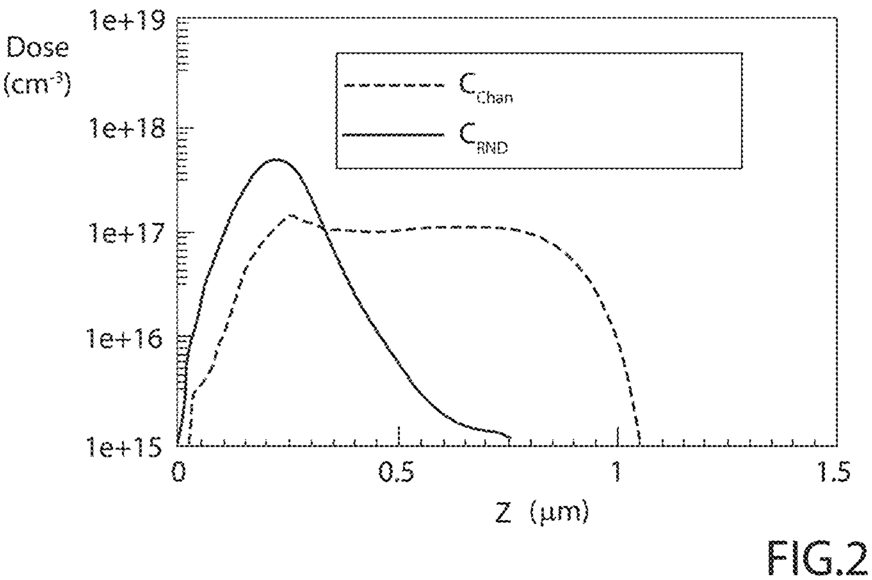
FIGS. 2 and 3 show graphs of doping profiles implementable with the aforementioned ion implantation.

FIG. 2 shows the implant profile (i.e., the implant dose as a function of the depth along the vertical axis z) in two different conditions: with an implantation performed in channeling condition, in the example with tilt angle equal to 4° (CHAN, profile shown in dashed line); and with a random implantation (RND, profile shown in solid line).

It is evident that the channeled implant allows a substantially flat doping profile to be obtained, within a desired depth starting from the front surface 1*a* of the wafer 1 (this depth being for example comprised between 0.5 and 5 μm, for example equal to 2 μm).

The present Applicant has experimentally demonstrated that the discussed channeled ion implantation allows a very precise control of the doping of the implanted regions 12 to be obtained, in particular with variations lower than 1% with respect to a desired value. The aforementioned channeled ion implantation also allows for a very precise control of the depth of the implanted regions 12, in particular with variations lower than 1% with respect to a desired value.

In greater detail, the profile implanted due to the aforementioned channeled ion implantation may be expressed as:

$$C_{tot}(z)=\alpha(d)C_{Rnd}(z)+(1-\alpha(d))C_{Chan}(z)$$

Where $C_{tot}(z)$ is the total implanted profile (expressed in terms of implant dose as a function of the depth z along the vertical axis Z); $C_{Rnd}(z)$ is the purely random profile component (in case the channeling is completely prevented by the damaged crystal lattice), shown in solid line in the aforementioned FIG. 2; $C_{chan}(z)$ is the channeled profile component, shown in dashed line in the aforementioned FIG. 2; and α(d), with $\alpha(d)\leq 1$, is a function of the accumulated damage d in the aforementioned damaged regions 10, damage which increases, for example, as the implanted dose or the intensity of the etching carried out increases. Basically, the function α(d) in the aforementioned expression represents the percentage of the implantation available for channeling.

Figure 3:
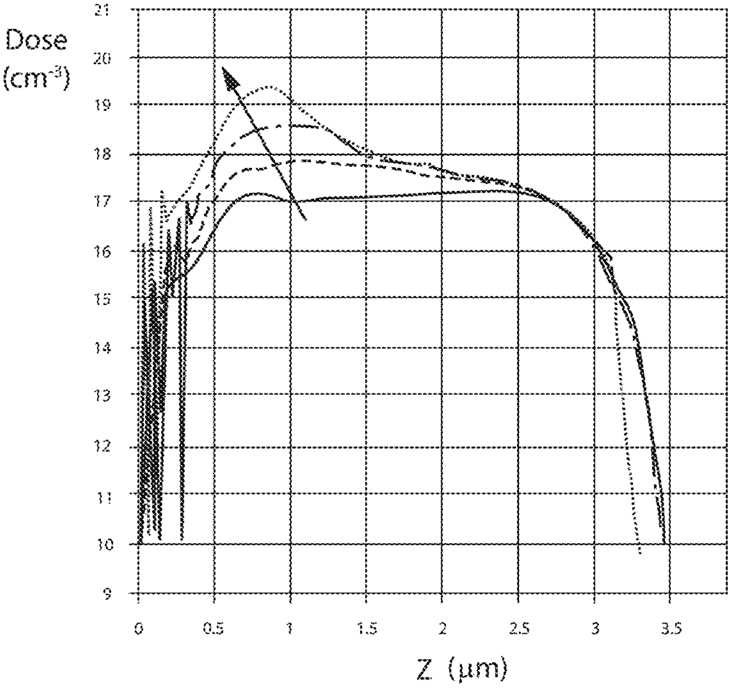

As shown in FIG. 3, as the damage accumulation increases (as indicated by the arrow), i.e., as α(d)) increases, the implanted profile moves from the purely channeled profile (corresponding to a substantially zero value of α(d)) towards the purely random profile (corresponding to a substantially unitary value of α(d)), with a corresponding variation of both concentration peak and implant depth.

It follows that the modulation of the α(d) value (for example as a function of the properties of the surface implant performed for forming the damaged regions 10) allows the concentration peak and depth properties of the implanted regions 12 to be determined in a desired manner.

Figure 4:
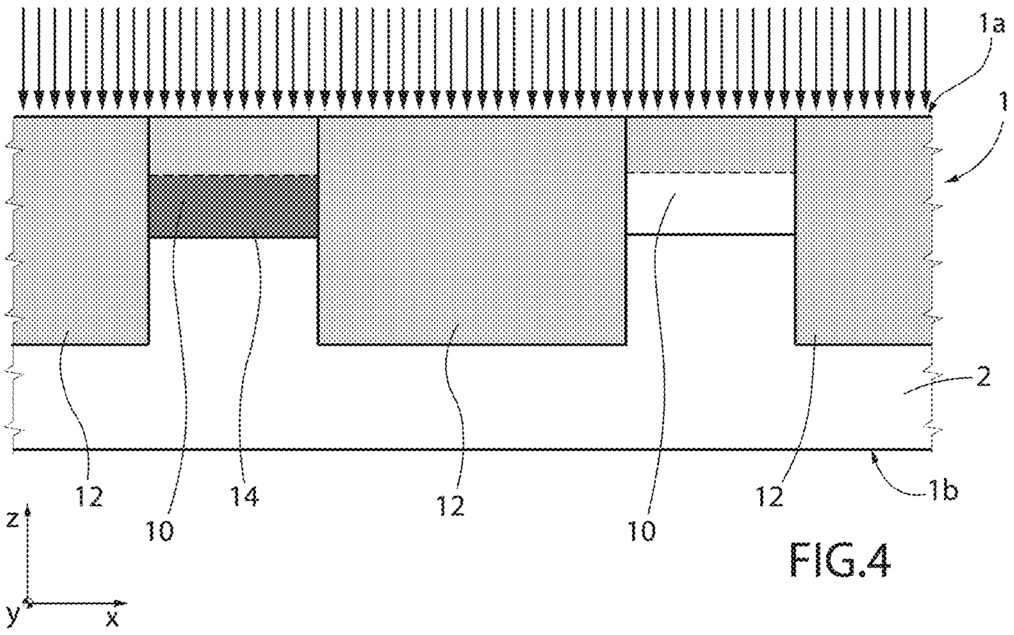
FIGS. 4 and 5 show the cross-section of the wafer, according to variants of the manufacturing process.

In particular, as shown in FIG. 4, doped regions 14 may thus be formed at the damaged regions 10, possibly in part below the same damaged regions 10, having a mixed implant profile (obtained as a combination of the aforementioned purely random and purely channeled profiles).

At the end of the channeled ion implantation, the implanted regions 12, having a substantially channeled implant profile and also the doped regions 14, having a mixed implant profile, may therefore be formed in the semiconductor body 2.

Within at least some of the damaged regions 10, the implantation instead produces a substantially negligible effect, with a substantially random implant profile at the front surface 1*a* of the wafer 1 (and no doping variation below the same damaged regions 10).

Figure 5:
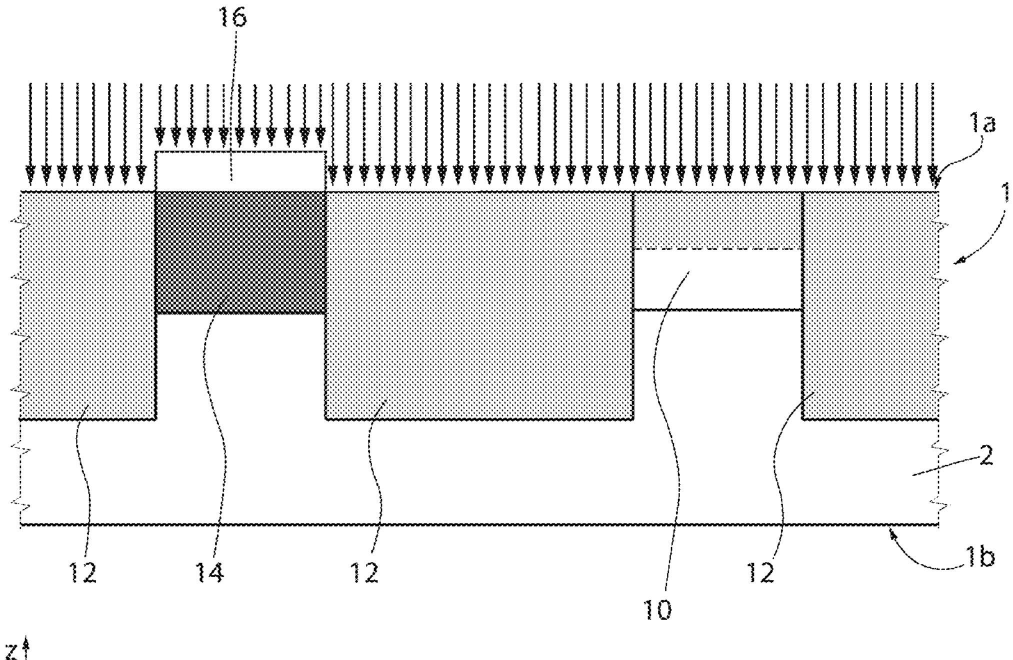

According to a further aspect of the present disclosure, as shown in FIG. 5, one or more shield regions 16 may be formed above the front surface 1*a* of the wafer 1, on portions of the semiconductor body 2 where it is desired to form doped regions 14 with an implant profile different from the channeled implant, for example with a mixed implant profile.

The aforementioned shield regions 16 are made of an amorphous material (such as an oxide or nitride) having defocusing properties for the implanted ion beam, in such a way as to reduce the channeling condition, thus acting as de-channeling regions.

In the presence of these shield regions 16, the profile implanted due to the aforementioned channeled ion implantation may be expressed in the following manner:

$$C_{tot}(z) = \gamma_E(th)C_{Rnd}(z) + (1 - \gamma_E(th))C_{Chan}(z)$$

where $\gamma_E$(th) is a function of the thickness th of the shield regions 16 and the energy E of the implant, which therefore represents in this case the percentage of the implantation available for channeling.

Figures 6, 7A:
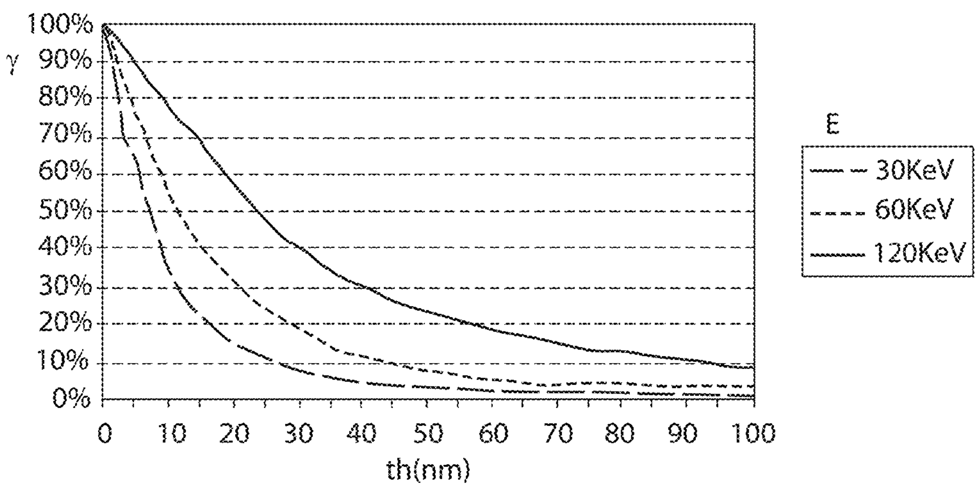
FIG. 6 shows the trend of a function associated with the ion implantation.
FIGS. 7A-7C are cross-sections of the wafer in successive steps of a process for manufacturing a MOSFET transistor, according to a further aspect of the present disclosure.

A possible trend of this function $\gamma_E$(th) is shown in FIG. 6, as the thickness th of the shield regions 16 varies and at different values of the implant energy E.

As shown in the aforementioned FIG. 5, the implanted regions 12, having a substantially channeled implant profile and the doped regions 14, having a mixed implant profile, are therefore formed again in the semiconductor body 2 at the end of the channeled ion implantation. Within at least some of the damaged regions 10, the implantation instead produces a substantially negligible effect, with a substantially random implant profile at the front surface 1*a* of the wafer 1.

Again, it is highlighted that a same ion implantation step allows a modulation of the doping profile to be obtained, in a "patterned" manner in the semiconductor body 2, without resorting to the use of implant masks.

As previously indicated, the described present disclosure may find advantageous application in the manufacture of a power electronic device, for example a MOSFET transistor.

Referring now to FIG. 7A, the process for manufacturing a MOSFET transistor envisages formation, in the active area, of a plurality of elementary cells.

In particular, the process may first envisage formation of body regions 20 in the semiconductor body 2, at the front surface 1*a* of the wafer 1, by a masked implantation of doping ions of opposite type with respect to the same semiconductor body 2, for example of a p-type (it is highlighted that this implantation is performed in a traditional manner, i.e., with a random ion implant, with a substantially zero tilt angle).

The body regions 20 are separated from each other along the x axis of the horizontal plane xy, at a certain distance; in particular, the portions of the semiconductor body 2 (which in this case represent a drift layer of the MOSFET transistor) between adjacent body regions 20, at the front surface 1*a*, are intercell or JFET regions and are denoted by 21.

Subsequently, as indicated in the same FIG. 7A, respective source regions 22 are formed, again by masked implant of ions, in this case of n-type (for example with nitrogen or phosphorus ions), within each body region 20 (centrally with respect thereto). These source regions 22 have a depth along the vertical axis z smaller than a corresponding depth of the same body regions 20.

Then, as shown in the same FIG. 7A, body contact regions 24 are formed within some of the source regions 22 (centrally with respect thereto) and at the front surface 1*a* of the wafer 1.

These body contact regions 24, which have the purpose of creating an ohmic contact with the respective body regions 20, are formed again by masked implant of ions, in this case of $p^+$ type with a high doping dose.

Figures 7B, 7C:
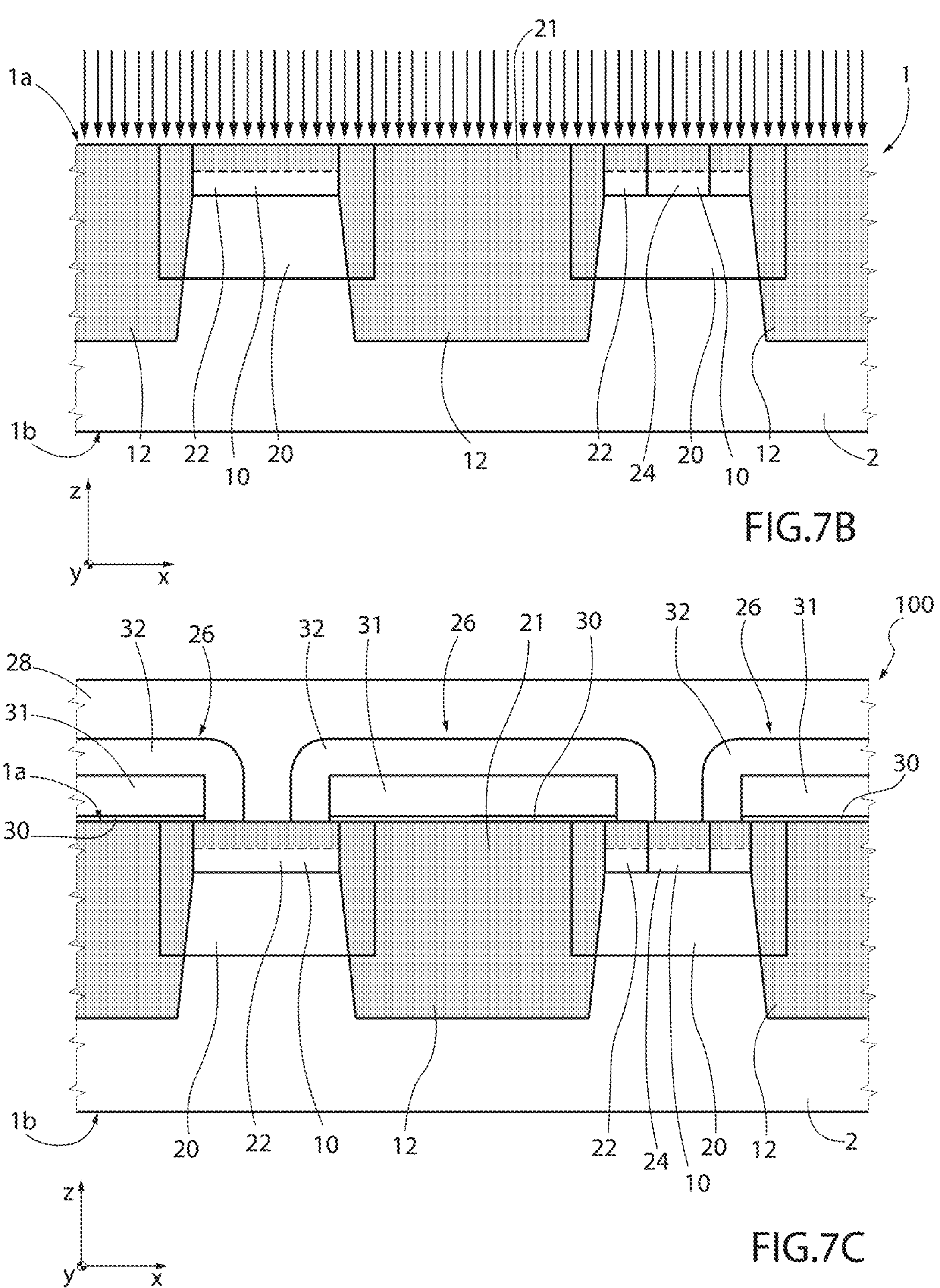

At this point of the manufacturing process, FIG. 7B, the channeled ion implantation is performed, as previously discussed, exploiting the source regions 22 (and the body contact regions 24) as the aforementioned damaged regions 10, such surface regions being in fact heavily damaged from the point of view of the crystal lattice.

As a result, the ion implantation in channeling condition is performed in a self-aligned manner with respect to the source regions 22, so that the implanted ions proceed in depth, in channeling condition, only at the JFET regions 21, where the aforementioned implanted regions 12 are formed.

In this case, these implanted regions 12 are portions of a Current Spreading Layer (CSL) of the MOSFET transistor, which is used in the JFET regions 21 to reduce the on-state resistance ($R_{on}$).

Advantageously, the implanted regions 12, which therefore are distinct portions of the current spreading layer, allow the resistivity of the JFET regions 21 to be reduced in a desired manner, while not varying the characteristics of the portions of the semiconductor body 2 underlying the source regions 22, in particular, without increasing the doping thereof and without varying the characteristics of the body/drain junctions of the MOSFET transistor.

After the channeled ion implantation, the wafer 1 may be subject to annealing for activating the doping ions and for reducing defects in the crystal lattice.

Then, as shown in FIG. 7C, insulated gate structures 26 on the front surface 1*a* of the wafer 1 and a source metallization region 28 are formed.

In particular, the insulated gate regions 26 are each formed by: a gate insulating region 30, for example of oxide, in contact with the front surface 1*a* of the wafer 1, above the aforementioned JFET region 21; a gate conductive region 31, of a conductive material, directly superimposed on the gate insulating region 30; and a passivation region 32, covering the gate conductive region 31 and sealing, together with the gate insulating region 30, the gate conductive region 31.

The gate conductive regions 31 of the insulated gate structures 26 are electrically connected in parallel, in a manner not shown here, forming a gate terminal of the MOSFET power electronic device.

The source metallization region 28, for example of metal material and/or metal silicide, forms a source terminal of the MOSFET power electronic device and extends on the front surface 1*a* of the wafer and on the insulated gate structures 26, in direct electrical contact with the source regions 22 and the body contact regions 24.

In a manner not illustrated, a further metallization region may be formed on the rear surface 1*b* of the wafer 1, to form a drain terminal of the same power electronic device.

Each elementary cell of the MOSFET power electronic device, indicated as a whole by 100 in FIG. 7D, is therefore formed by an insulated gate structure 26 and by the adjacent portions of the body 20 and source 22 regions, as well as by the underlying JFET region 21.

The advantages of the present disclosure are clear from the preceding description.

In any case, it is highlighted that this present disclosure allows localized ion implants to be formed in a semiconductor body by a single channeled ion implantation step, in the absence of implant masks, improving the yield and reducing the costs of the manufacturing process (in fact avoiding the repetition of a number of implant steps), while improving the electrical characteristics of the resulting electronic device (owing for example to the absence of masks for performing the implant).

Furthermore, the possibility of using, as damaged regions to implement a self-aligned implantation, doped regions previously formed during the manufacturing process of the electronic device (such as for example the discussed body and/or source regions in the case of MOSFET transistors) may be advantageous.

Finally, it is clear that modifications and variations may be made to what is described and illustrated herein without thereby departing from the scope of the present disclosure, as defined in the attached claims.

In particular, it is highlighted that the described present disclosure may also find advantageous application in different power electronic devices, for example in diodes or JFET transistors.

The channeled ion implantation may be performed with different doping ions, for example with nitrogen atoms (instead of phosphorus atoms). However, using phosphorus has proved to be particularly advantageous due to the resulting flat doping profile of the current spreading layer.

Furthermore, the wafer of semiconductor material may be made of a material other than SiC, such as for example GaN.

A manufacturing process may be summarized as including: forming a semiconductor body (2) of silicon carbide, having a front surface (1*a*); and performing a localized ion implantation to form implanted regions (12) in implant portions of the semiconductor body (2); wherein performing a localized ion implantation includes: forming damaged regions (10) at said front surface (1*a*), separated from each other by said implant portions in a direction (x) parallel to said front surface (1*a*); and performing a channeled ion implantation, for implanting doping ions within said semiconductor body (2) and forming said implanted regions (12) at said implant portions of the semiconductor body (2), wherein said channeled ion implantation is performed in a self-aligned manner with respect to said damaged regions (10), constituting damaged regions of the silicon carbide crystallographic lattice such as to block propagation of said channeled ion implantation along a vertical axis (z) orthogonal to said front surface (1*a*), in a depth direction of said semiconductor body (2).

Forming damaged regions (10) may include, alternatively: performing a masked unchanneled surface ion implant, with a lower energy with respect to said channeled ion implantation; or performing one or more surface etching steps of the semiconductor body (2), starting from the front surface (1*a*).

Said implanted regions (12) may have a substantially flat channeled doping profile along said vertical axis (z) in the depth direction of said semiconductor body (2); and wherein said channeled ion implantation may determine at said damaged regions (10) an implant profile with smaller depth with respect to said channeled doping profile and an implant peak in proximity of said front surface (1*a*).

The process may include modulating an amount of damage ($\alpha(d)$) caused by said damaged regions (10) in the silicon carbide crystal lattice, to modulate a doping profile of the implanted regions (12) along said vertical axis (z).

Said doping profile may be given by:

$$C_{tot}(z)=\alpha(d)C_{Rnd}(z)+(1-\alpha(d))C_{Chan}(z)$$

where $C_{tot}(z)$ is said doping profile as a function of the depth along the vertical axis (z); $C_{Rnd}(z)$ is a purely random profile component, corresponding to the case where the channeling is prevented by the crystal lattice; $C_{chan}(z)$ is a purely channeled profile component, corresponding to the case where the channeling is not prevented by the crystal lattice; and $\alpha(d)$, with $\alpha(d)\leq 1$, is a function of the accumulated damage in the damaged regions (10).

The process may further include forming, at some of the damaged regions (10), doped regions (14) with a mixed implant profile, obtained as a combination of said purely random ($C_{Rnd}(z)$) and purely channeled ($C_{chan}(z)$) profiles.

The process may further include forming at least one shield region (16) above the front surface (1*a*) of the semiconductor body (2), having a thickness (th) along said vertical axis (z); wherein performing a channeled ion implantation includes forming, in a portion of the semiconductor body (2) underlying said shield region (16), a respective doped region (14) with a doping profile different from the doping profile of said implanted regions (12).

Said shield region (16) made be made of a material having defocusing properties for the implanted ion beam, in such a way as to reduce a channeling condition thereof, thus operating as de-channeling region.

In the presence of said shield region (16), the doping profile due to the aforementioned channeled ion implantation may be given by:

$$C_{tot}(z)=\gamma_E(th)C_{Rnd}(z)+(1-\gamma_E(th))C_{Chan}(z)$$

where $C_{tot}(z)$ is said doping profile as a function of the depth along the vertical axis (z); $C_{Rnd}(z)$ is a purely random profile component, corresponding to the case where the channeling is completely prevented by the crystal lattice; $C_{chan}(z)$ is a purely channeled profile component, corresponding to the case where the channeling is not prevented by the crystal lattice; and $\gamma_E(th)$ is a function of the thickness (th) of the shield region (16).

Said doping ions may be phosphorus atoms.

Said channeled ion implantation may be performed along an implantation direction tilted by a non-zero tilt angle.

Said tilt angle may be included between 3.5° and 4.5°, such that said channeled ion implantation is directed along a main axis of the silicon carbide crystallographic lattice of said semiconductor body (2) and the doping ions penetrate within said semiconductor body (2).

The process may include forming elementary cells of a power electronic device (100) in said semiconductor body (2); wherein forming elementary cells may include: forming first doped regions (20) at said front surface (1*a*), having a first conductivity type (n), separated from each other in said direction (x) by intercell regions of said power electronic device (100); wherein said damaged regions (10) may include said first doped regions (20) and said implant portions include said intercell regions and said channeled ion implantation is performed in a self-aligned manner with respect to said first doped regions (20).

Said implanted regions (12) may be portions of a current spreading layer of said power electronic device (100), having the first electrical conductivity (n) and a second doping value, greater than the first doping value; said portions being localized at said intercell regions and configured to locally modulate the resistivity of said intercell regions.

Said power electronic device (100) may be a MOSFET transistor.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A manufacturing process, comprising:

forming a semiconductor body of silicon carbide having a surface; and performing a localized ion implantation forming implanted regions in implant portions of the semiconductor body, performing the localized ion implantation includes:

forming damaged regions at the surface separated from each other by the implant portions in a direction parallel to the surface; and performing a channeled ion implantation for implanting doping ions within the semiconductor body forming the implanted regions at the implant portions of the semiconductor body, and wherein the channeled ion implantation is performed in a self-aligned manner with respect to the damaged regions, constituting the damaged regions of the silicon carbide crystallographic lattice to block propagation of the channeled ion implantation along an axis orthogonal to the surface in a depth direction of the semiconductor body.

2. The process according to claim 1, wherein forming the damaged regions includes performing a masked unchanneled surface ion implant, with a lower energy with respect to said channeled ion implantation.

3. The process according to claim 1, wherein forming the damaged regions includes performing one or more surface etching steps of the semiconductor body, starting from the front surface.

4. The process according to claim 1, wherein said implanted regions have a substantially flat channeled doping profile along said vertical axis in the depth direction of said semiconductor body; and wherein said channeled ion implantation determines at said damaged regions an implant profile with smaller depth with respect to said channeled doping profile and an implant peak in proximity of said front surface.

5. The process according to claim 4, comprising modulating an amount of damage caused by said damaged regions in the silicon carbide crystal lattice, to modulate a doping profile of the implanted regions along said vertical axis.

6. The process according to claim 5, wherein said doping profile is given by:

$$C_{tot}(z)=\alpha(d)C_{Rnd}(z)+(1-\alpha(d))C_{Chan}(z)$$

where $C_{tot}(z)$ is said doping profile as a function of the depth along the vertical axis; $C_{Rnd}(z)$ is a purely random profile component, corresponding to the case where the channeling is prevented by the crystal lattice; $C_{chan}(z)$ is a purely channeled profile component, corresponding to the case where the channeling is not prevented by the crystal lattice; and $\alpha(d)$, with $\alpha(d)\leq 1$, is a function of the accumulated damage in the damaged regions.

7. The process according to claim 6, further comprising forming, at some of the damaged regions, doped regions with a mixed implant profile, obtained as a combination of said purely random ($C_{Rnd}(z)$) and purely channeled ($C_{chan}(z)$) profiles.

8. The process according to claim 1, further comprising forming at least one shield region above the front surface of the semiconductor body, having a thickness (th) along the vertical axis; wherein performing a channeled ion implantation comprises forming, in a portion of the semiconductor body underlying the shield region, a respective doped region with a doping profile different from the doping profile of the implanted regions.

9. The process according to claim 8, wherein the shield region is made of a material having defocusing properties for the implanted ion beam, in such a way as to reduce a channeling condition thereof, thus operating as de-channeling region.

10. The process according to claim 8, wherein, in the presence of the shield region, the doping profile due to the aforementioned channeled ion implantation is given by:

$$C_{tot}(z)=\gamma_E(th)C_{Rnd}(z)+(1-\gamma_E(th))C_{Chan}(z)$$

where $C_{tot}(z)$ is the doping profile as a function of the depth along the vertical axis; $C_{Rnd}(z)$ is a purely random profile component, corresponding to the case where the channeling is completely prevented by the crystal lattice; $C_{chan}(z)$ is a purely channeled profile component, corresponding to the case where the channeling is not prevented by the crystal lattice; and $\gamma_E(th)$ is a function of the thickness (th) of the shield region.

11. The process according to claim 1, wherein the doping ions are phosphorus atoms.

12. The process according to claim 1, wherein the channeled ion implantation is performed along an implantation direction tilted by a non-zero tilt angle.

13. The process according to claim 12, wherein the tilt angle is comprised between 3.5° and 4.5°, wherein the channeled ion implantation is directed along a main axis of the silicon carbide crystallographic lattice of the semiconductor body and the doping ions penetrate within the semiconductor body.

14. The process according to claim 1, comprising forming elementary cells of a power electronic device in the semiconductor body; wherein forming elementary cells comprises: forming first doped regions at the front surface, having a first conductivity type, separated from each other in the direction by intercell regions of the power electronic device; wherein the damaged regions comprise the first doped regions and the implant portions comprise the intercell regions and the channeled ion implantation is performed in a self-aligned manner with respect to the first doped regions.

15. The process according to claim 14, wherein the implanted regions are portions of a current spreading layer of the power electronic device, having the first electrical conductivity and a second doping value, greater than the first doping value; the portions being localized at the intercell regions and configured to locally modulate the resistivity of the intercell regions.

16. The process according to claim 14, wherein the power electronic device is a MOSFET transistor.

17. A manufacturing process, comprising:

forming a semiconductor body of silicon carbide having a surface;

forming damaged regions at the surface separated from each other by implant portions in a direction parallel to the surface; and forming a shield region on the surface of the semiconductor body overlapping a respective damaged region of the damaged regions;

performing a channeled ion implantation for implanting doping ions within the semiconductor body forming the implanted regions at the implant portions of the semiconductor body, and wherein the channeled ion implantation is performed in a self-aligned manner with respect to the damaged regions, constituting damaged regions of the silicon carbide crystallographic lattice to block propagation of the channeled ion implantation along an axis orthogonal to the surface in a depth direction of the semiconductor body.

18. The manufacturing process of claim 17, wherein the shield region is made of a material having defocusing properties for the implanted ion beam, in such a way as to reduce a channeling condition thereof, thus operating as de-channeling region.

19. A manufacturing process, comprising:

forming a damaged region at a surface of a silicon-carbide substrate adjacent to an implant portion of the silicon-carbide at the surface of the silicon-carbide substrate; and performing a channeled ion implantation for implanting doping ions within the semiconductor body forming an implanted region at the implant portion of the semiconductor body and forming a random doping profile portion at the damage region, and wherein the channeled ion implantation is performed in a self-aligned manner with respect to the damaged region, crystallographic lattice of the damaged region of the silicon carbide crystallographic lattice blocks propagation of the channeled ion implantation along an axis transverse to the surface in a depth direction of the semiconductor body.

20. The manufacturing process of claim 19, wherein:

the random doping profile portion has a first depth; and the implanted region has a second depth greater than the first depth.

* * * * *